(12) United States Patent
Chen et al.

(10) Patent No.: US 7,723,785 B2
(45) Date of Patent: May 25, 2010

(54) HIGH PERFORMANCE POWER MOS STRUCTURE

(75) Inventors: Yu Wen Chen, Baoshan Township, Hsinchu County (TW); Fu-Hsin Chen, Jhudong Township, Hsinchu County (TW); Tsung-Yi Huang, Hsin-Chu (TW); Yt Tsai, Sinpu Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 127 days.

(21) Appl. No.: 11/831,689

(22) Filed: Jul. 31, 2007

(65) Prior Publication Data

US 2009/0032868 A1    Feb. 5, 2009

(51) Int. Cl.
    *H01L 29/78* (2006.01)
(52) U.S. Cl. .................. 257/335; 257/E29.257
(58) Field of Classification Search .................. 438/200, 438/314–316, 308, 340; 257/335, E29.257, 257/340, 200, 314–316
See application file for complete search history.

(56) References Cited

U.S. PATENT DOCUMENTS

| | | | |
|---|---|---|---|
| 5,591,657 A * | 1/1997 | Fujishima et al. ........... | 438/202 |
| 6,281,550 B1 * | 8/2001 | Chi ............................. | 257/347 |
| 6,727,534 B1 | 4/2004 | Buller et al. | |
| 7,002,213 B2 * | 2/2006 | Chi ............................. | 257/349 |
| 7,378,708 B2 * | 5/2008 | Lee et al. .................... | 257/328 |
| 7,453,127 B2 * | 11/2008 | Wu et al. .................... | 257/401 |
| 2006/0099764 A1 | 5/2006 | Zuniga et al. | |

FOREIGN PATENT DOCUMENTS

CN    1606811 A    4/2005

OTHER PUBLICATIONS

Sakai, Shigeru et al., "Deposition Uniformity Control in a Commercial Scale HTO-CVD Reactor", 1995-2007, Material Research Society, Warrendale, Pennsylvania, USA, 1 page. http://www.mrs.org/s_mrs/sec_subscribe.asp?CID=8749&DID=195319&action=detail.

* cited by examiner

*Primary Examiner*—Nathan W Ha
(74) *Attorney, Agent, or Firm*—Haynes and Boone, LLP

(57) ABSTRACT

A semiconductor device includes a source region and a drain region disposed in a substrate wherein the source and drain regions have a first type of dopant; a gate electrode formed on the substrate interposed laterally between the source and drain regions; a gate spacer disposed on the substrate and laterally between the source region and the gate electrode, adjacent a side of the gate electrode; and a conductive feature embedded in the gate spacer.

18 Claims, 8 Drawing Sheets

HIGH PERFORMANCE POWER MOS STRUCTURE

BACKGROUND

As semiconductor circuits such as metal-oxide-semiconductor field effect transistors (MOSFETs) are adapted for high power applications, problems arise with respect to high on-resistance issue. In a MOSFET device, such as high power lateral diffused metal-oxide semiconductor (LDMOS) structures, when a high power is applied to the gate, an electrical channel under the gate stack has higher on-resistance and low saturation current. As a result, the LDOMS power transistor's performance is degraded.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
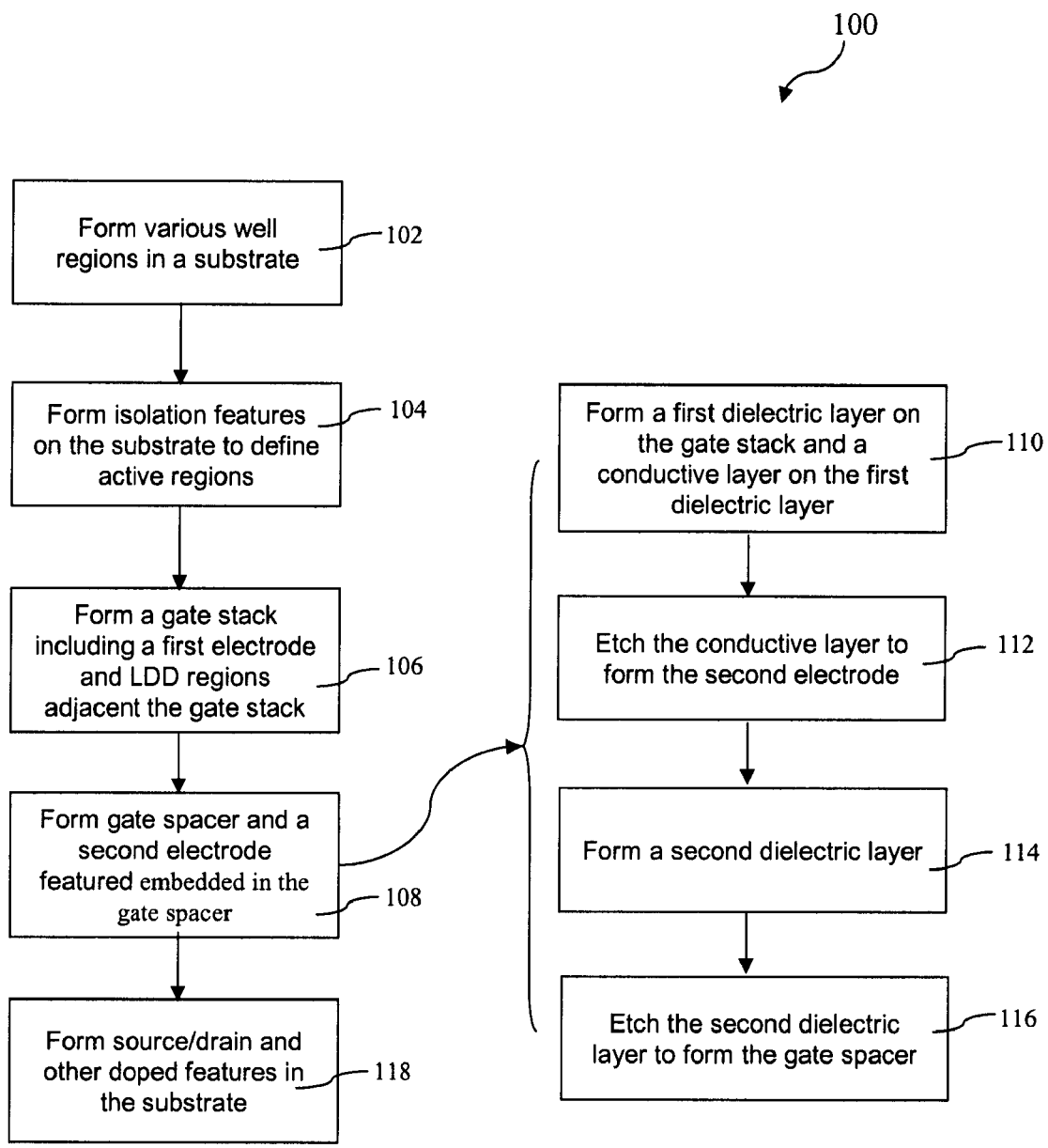
FIG. 1 is a flowchart of one embodiment of a method for making an integrated circuit constructed according to aspects of the present disclosure.

The present disclosure relates generally to the field of semiconductor integrated circuits. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of one embodiment of a method for making an integrated circuit 100. FIGS. 2-9 are various cross-sectional views of an integrated circuit 200 in one embodiment, in portion or entirety, during various fabrication stages, fabricated by the method of FIG. 1. The method 100 or the integrated circuit 200 each is one example of a method or an integrated circuit, respectively, that can benefit from various embodiments or aspects of the present invention. For the sake of further example, the integrated circuit 100 has a polysilicon feature embedded in a gate spacer between a source region and a gate electrode, as discussed in greater detail below. With reference to FIGS. 1 through 9, the method 100 and the integrated circuit 200 are collectively described below. It is understood that additional steps can be provided before, during, and after the method 100, and some of the steps described below can be replaced or eliminated, for additional embodiments of the method. It is further understood that additional features can be added in the integrated circuit 200, and some of the features described below can be replaced or eliminated, for additional embodiments of the integrated circuit.

Figure 2:
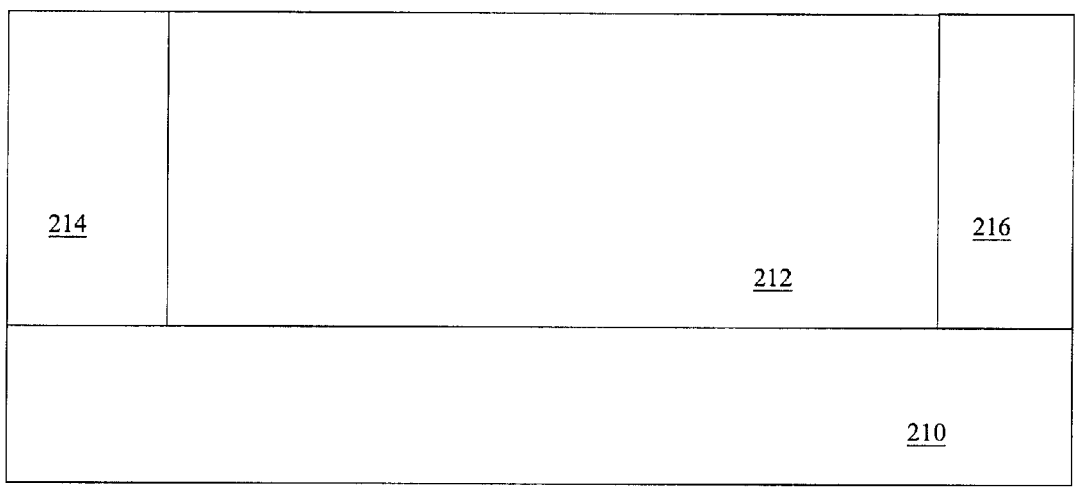
FIGS. 2-4 and 9 are various cross-sectional views of one embodiment of an integrated circuit during various fabrication stages, made by the method of FIG. 1.

Referring to FIGS. 1 and 2, the method begins at step 102 by forming various well regions in a substrate 210. The substrate 210 may be or comprise a semiconductor wafer such as a silicon wafer. Alternatively, the substrate 210 may include other elementary semiconductors such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer overlying a bulk semiconductor. Various doped features, such as a well region, a source region and a drain region described below, may be formed in the epitaxy layer. Furthermore, the substrate 210 may include a semiconductor-on-insulator (SOI) structure. For example, the substrate may include a buried oxide (BOX) layer formed by a process such as separation by implanted oxygen (SIMOX). In various embodiments, the substrate 210 may include a buried layer such as an N-type buried layer (NBL), a P-type buried layer (PBL), and/or a buried dielectric layer including a buried oxide (BOX) layer. For example, a P-type substrate may include an NBL at least under a P-type metal oxide semiconductor field effect transistor (PMOSFET).

Located in the substrate 210 are a N-well region 212 (also referred to as a power N-well) and P-well regions 214 and 216 (each also referred to as a power P-well) disposed adjacent the N-well region 212. The P-well regions 214 and 216 are configured to laterally surround the N-well region 212 in one embodiment. The N-well region 212 and the P-well regions 214 and 216 are portions of substrate 210, and are formed by various ion implantation processes. Alternatively, the N-well region 212 and the P-well regions 214/216 may be portions of an epitaxy layer such as a silicon epitaxy layer formed by epitaxy processing. The N-well region 212 has a N-type dopant such as phosphorus, and the P-well regions 214 and 216 have an P-type dopant such as boron. In one embodiment, the well regions 212, 214 and 216 are formed by a plurality of processing steps, whether now known or to be developed, such as growing a sacrificial oxide on substrate 210, opening a pattern for the location(s) of the P-well regions or N-well region, and implanting the impurities.

Figure 3:
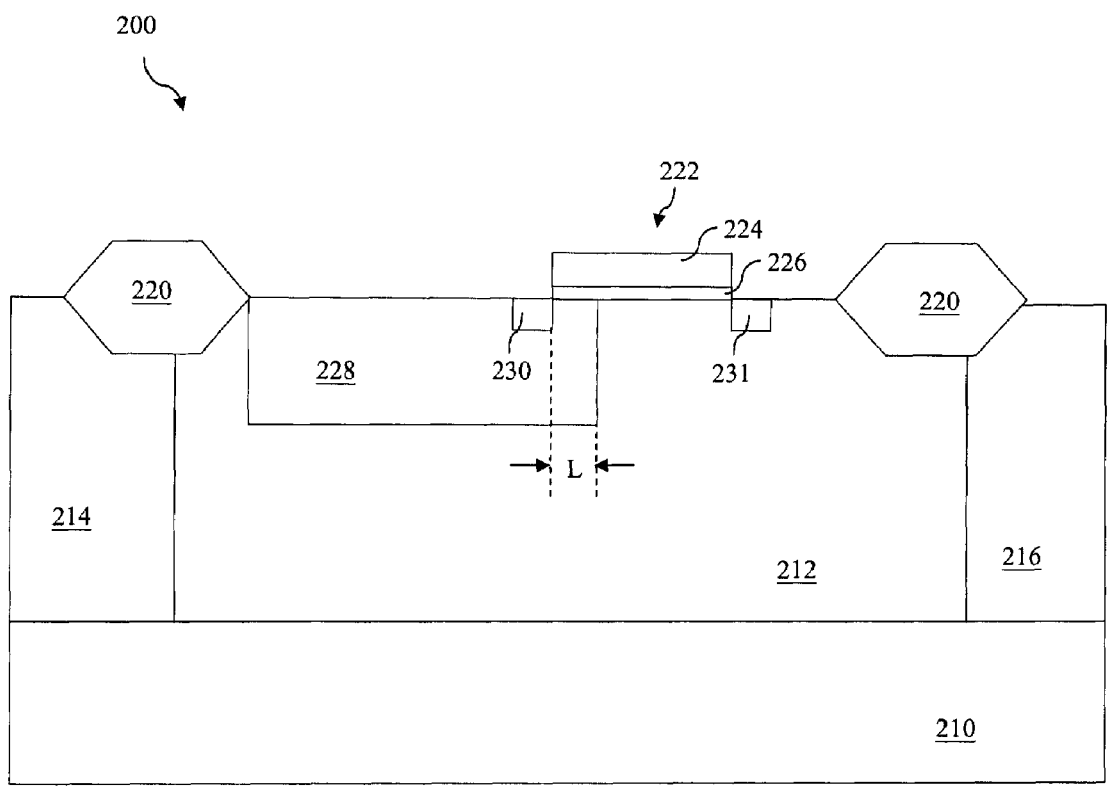

Referring to FIGS. 1 and 3, the method 100 proceeds to step 104 by forming various isolation features 220 on the substrate 210. An isolation feature structure such as shallow trench isolation (STI) or local oxidation of silicon (LOCOS) including the isolation feature 220 may be formed on the substrate to define and electrically isolate various active regions. As one example, the formation of an STI feature may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride.

Still referring to FIGS. 1 and 3, the method 100 proceeds to step 106 by forming a gate stack 222 including a gate electrode 224 and a gate dielectric 226 and forming various light doped regions including light doped source region 228 and light doped drain region 230 (also referred to as LDD regions) in the substrate 210.

The gate stack 222 is disposed on the substrate, including the gate dielectric 226 on the substrate 210 and the gate electrode 224 on the gate dielectric 226. The gate stack further includes other features such as spacers described below. The gate dielectric 226 includes a silicon dioxide layer disposed on the substrate 210. Alternatively, the gate dielectric 226 may include silicon oxide, high dielectric-constant (high k) materials, silicon oxynitride, other suitable materials, or combinations thereof. The high k material may be selected from metal oxides, metal nitrides, metal silicates, transition metal-oxides, transition metal-nitrides, transition metal-silicates, oxynitrides of metals, metal aluminates, zirconium silicate, zirconium aluminate, HfO2, or combinations thereof. The gate dielectric may have a multilayer structure such as one layer of silicon oxide and another layer of high k material. The gate dielectric layer 226 may have a thickness ranging between about 20 Angstroms and about 200 Angstroms. The gate dielectric 226 may be formed using chemical vapor deposition (CVD), physical vapor deposition (PVD), atomic layer deposition (ALD), thermal oxide, other suitable processes, or combinations thereof.

The gate electrode 224 is designed to be coupled to metal interconnects and is disposed overlying the gate dielectric 226. The gate electrode 226 includes doped polycrystalline silicon (or polysilicon). Alternatively, the gate electrode layer may include doped poly-silicon, metal such as Al, Cu, W, Ti, Ta, TiN, TaN, NiSi, CoSi, other suitable conductive materials, or combinations thereof. The gate electrode layer may be formed by CVD, PVD, plating, and other proper processes. The gate electrode layer may have a multilayer structure and may be formed in a multiple-step process.

The gate dielectric layer and the gate electrode layer formed on the substrate are then patterned to form a plurality of gate stacks using a process including photolithography patterning and etching. One exemplary method for patterning the gate dielectric and electrode layers is described below. A layer of photoresist is formed on the polysislicon layer by a suitable process, such as spin-on coating, and then patterned to form a patterned photoresist feature by a proper lithography patterning method. The pattern of the photoresist can then be transferred by a dry etching process to the underlying polysilicon layer and the gate dielectric layer to form gate electrodes 224 and gate dielectric 226, as shown in FIG. 3, in a plurality of processing steps and various proper sequences. For example, the polysilicon layer is etched using a dry etching process with chemical $SF_6$ and HBR, with pressure ranging between about 20 and about 30 mtorr, and/or with radio frequency power ranging between about 240 W and about 280 W. The photoresist layer may be stripped thereafter. In another embodiment, only the gate electrode layer is patterned. In another embodiment, a hard mask layer may be used and formed on the polysilicon layer. The patterned photoresist layer is formed on the hard mask layer. The pattern of the photoresist layer is transferred to the hard mask layer and then transferred to the polysilicon layer to form the gate electrode. The hard mask layer may include silicon nitride, silicon oxynitride, silicon carbide, and/or other suitable dielectric materials, and may be formed using a method such as CVD or PVD.

A p-type base (also referred to as p-body) region 228 is formed in the N-well region 212. The p-type base region 218 is laterally interposed between the isolation feature 220 and the gate electrode 224. The p-type base region 228 is further extended to a portion of the substrate 210 underneath the gate electrode 224 such that the p-type base region 228 is partially underlying the gate electrode 224 to define a channel with a channel length "L" illustrated in FIG. 3. The p-type base region 228 includes p-type dopant such as boron and is formed by a method including ion implantation. In one embodiment, the p-type base region 228 is formed by an ion-implantation process with a tilt angle such that the p-type base region 228 is extended partially underlying the gate electrode 224. In furtherance of the embodiment, the ion implantation process may utilize a tilt angle about 45 degree. In other embodiments, the tilt angle of the ion implantation is tuned for optimized channel length.

Light doped source region 230 and light doped drain region 231 (both also referred to as LDD regions) are formed in the substrate 210 after the formation of the gate dielectric 226 and gate electrode 224. The LDD regions 230 and 231 are laterally positioned on sidewalls of the gate electrode and interposed by the gate electrode. Each of the LDD regions 230 and 231 has an edge substantially self-aligned to an edge of the gate electrode 224, as illustrated in FIG. 3. The light doped source region is formed in the p-type base region 228. The LDD regions include n-type dopant such as phosphorus or arsenic. The LDD regions are formed by a method including ion implantation or diffusion.

Figure 4:
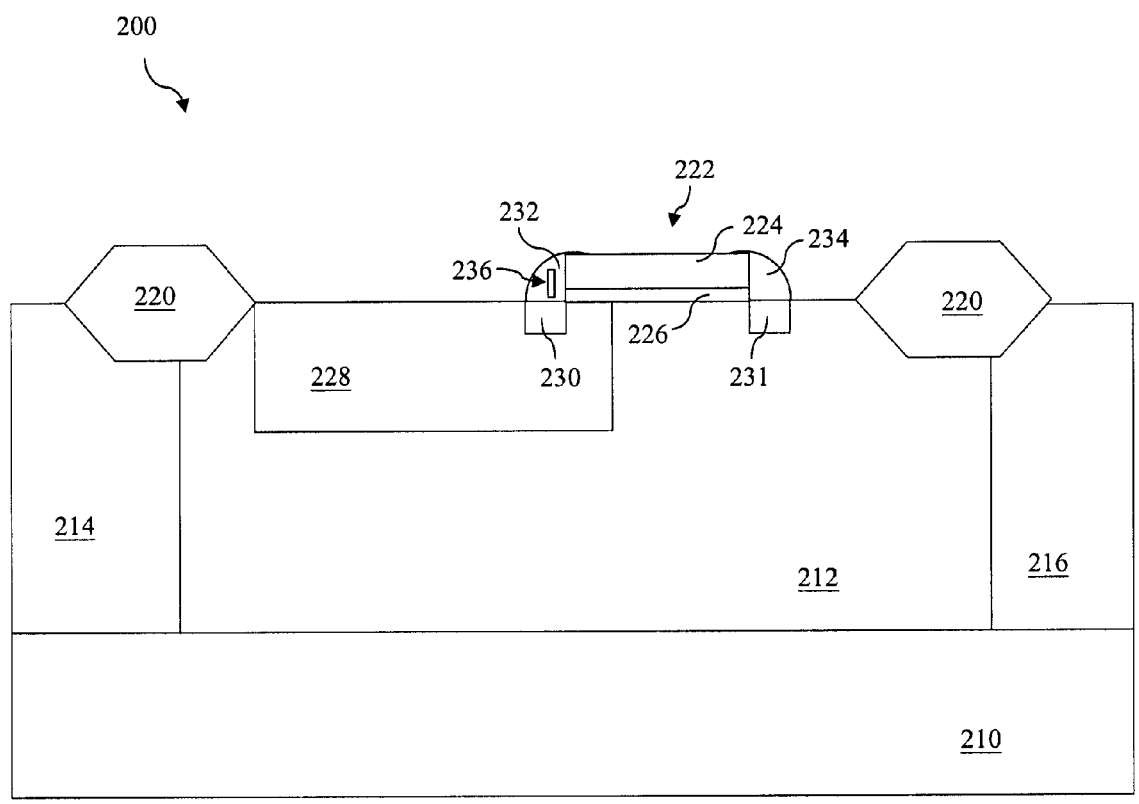
Figure 5:
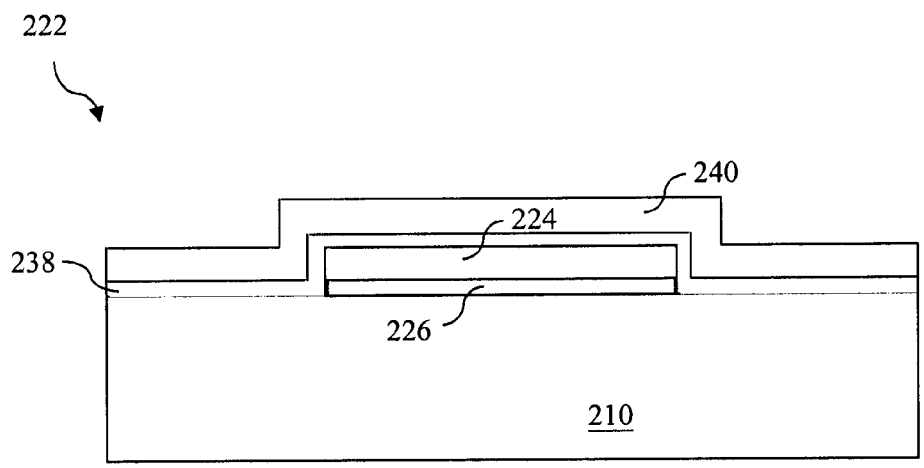
FIGS. 5-8 are various cross-sectional views of one embodiment of a portion of an integrated circuit during various fabrication stages, made by the method of FIG. 1.

Referring to FIGS. 1 and 4, the method 100 proceeds to step 108 by forming a gate spacer and a conductive feature embedded in the gate spacer. Gate spacers 232 and 234 are formed on both sidewalls of the gate stack 222. Particularly, a conductive feature (or second electrode) 236 is embedded in the gate spacer 232 overlying the light doped source region 230. Optionally, another conductive feature is formed embedded in the gate spacer 234 overlying the light doped drain region 231. The gate spacers includes a dielectric material such as silicon oxide. Alternatively, the gate spacers include a dielectric material such as silicon nitride, silicon oxide, silicon carbide, silicon oxynitride, or combinations thereof. In one embodiment, the gate spacers have a multilayer structure. The embedded conductive feature 236 includes doped polycrystalline silicon. Alternatively, the embedded conductive feature 236 may include other suitable materials, such as metal, metal alloy, silicide, metal nitride, doped polysilicon, or combinations thereof. The embedded conductive feature 236 is separated from the substrate 210 by the dielectric material of the gate spacer 232 with a vertical distance to the substrate more than about 200 angstrom. The gate spacers and embedded conductive feature can be formed in a proper processing sequence. An exemplary method of forming the gate spacers and the embedded conductive feature is provided below.

Steps 110, 112, 114 and 116 of the method 100 provide a processing sequence for forming the gate spacers and the embedded conductive feature. FIGS. 5-8 illustrate sectional views of the gate stack 222 as a portion of the integrated circuit 200 in one embodiment during various fabrication stages. With reference to FIGS. 1 and 5-8, the exemplary method is described. At step 110, with reference to FIG. 5, a first dielectric layer 238 is formed on the gate electrode 224 and the substrate 210. A conductive layer 240 is formed on the dielectric layer 238. In one embodiment, the dielectric layer 238 having silicon oxide is formed by a CVD, such as high temperature silicon oxide chemical vapor deposition (HTOCVD), using chemical $N_2O$ and $SiH_2Cl_2$. The deposition temperature may range between about 800 and about 830° C. In another embodiment, the conductive layer 240 having polysilicon is formed by CVD using silane ($SiH_4$). The deposition temperature may range between about 600 and about 630° C. The polysilicon layer 240 is further doped with phosphorus using chemicals $N_2O$ and $POCl_3$. The doping temperature ranges between about 800 and about 830° C.

Figure 6:
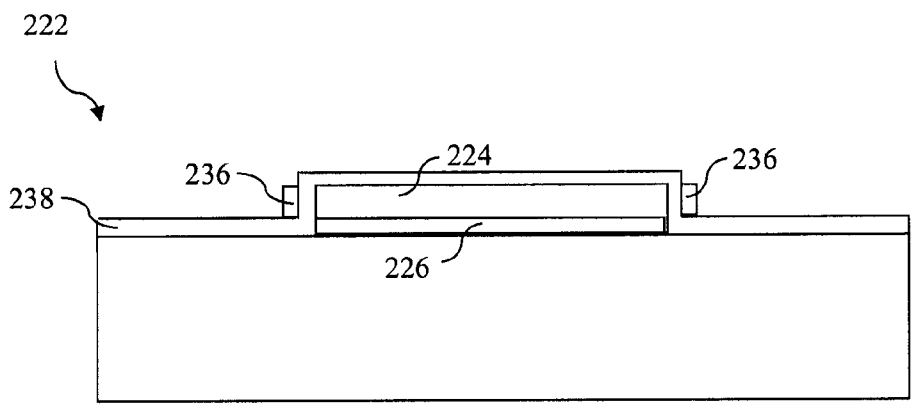

At step 112, with reference to FIG. 6, an etching process such as a dry etching technique is applied to the polysilicon layer 240 to substantially remove the polysilicon layer with only the conductive features (second electrode) 236 remaining on the dielectric layer 238 and proximate to the sidewalls of the gate electrode 224 as illustrated in FIG. 6. In one embodiment, the polysilicon layer 240 is etched using a dry etching process with chemical $Cl_2$ and HBR, with a pressure ranging between about 300 and about 600 mtorr, and/or with radio frequency power ranging between about 380 W and about 420 W. In another embodiment, the conductive feature 236 on the drain side and overlying the light doped drain region may be optionally removed by a processing sequence including photolithography patterning and wet etching.

Figure 7:
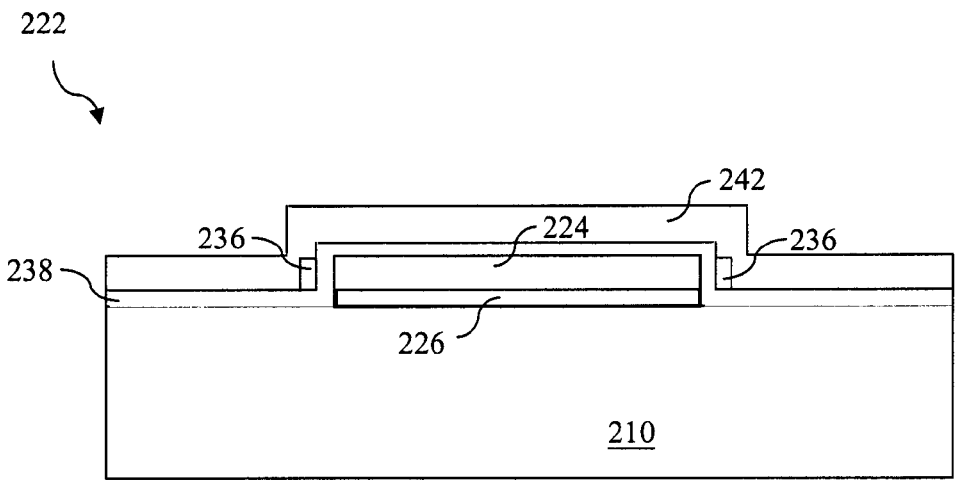

At step 114, with reference to FIG. 7, a second dielectric layer 242 is formed on the first dielectric layer 238 and the conductive feature 236 using a method such as CVD. The second dielectric layer 242 includes silicon oxide. Alternatively, the second dielectric layer 242 uses a material such as silicon oxide, silicon nitride, silicon oxynitride, other suitable materials, or combinations thereof. In one embodiment, a CVD process is implemented using chemical tetraethoxysilane (TEOS) and a deposition temperature ranging between about 680 and about 720° C.

Figure 8:
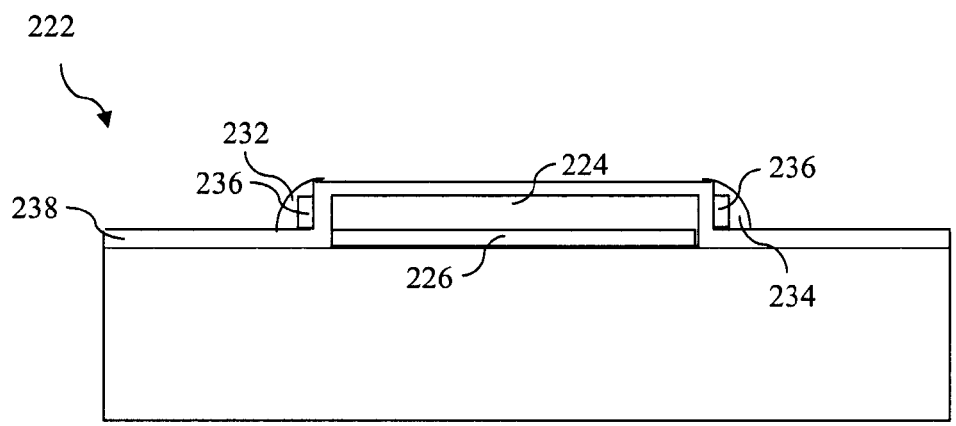

At step 116, with reference to FIG. 8, an etching process such as a dry etching technique is applied to the second dielectric layer 242 for the substantial removal thereof, leaving the gate spacers 232 and 234 proximate the sidewalls of the gate electrode 224 and having the conductive feature embedded therein. An anisotropic etching process such as a dry etching process may be used to etch the second dielectric layer 242. In one embodiment, a dry etching process is implemented using chemical Ar, $CF_4$ and $CHF_3$, with a pressure ranging between about 700 and about 850 mtorr, and/or with radio frequency power ranging between about 380 and about 420 W. The gate spacers 232/234 and embedded conductive feature 236 are formed as further illustrated in FIG. 4.

Figure 9:
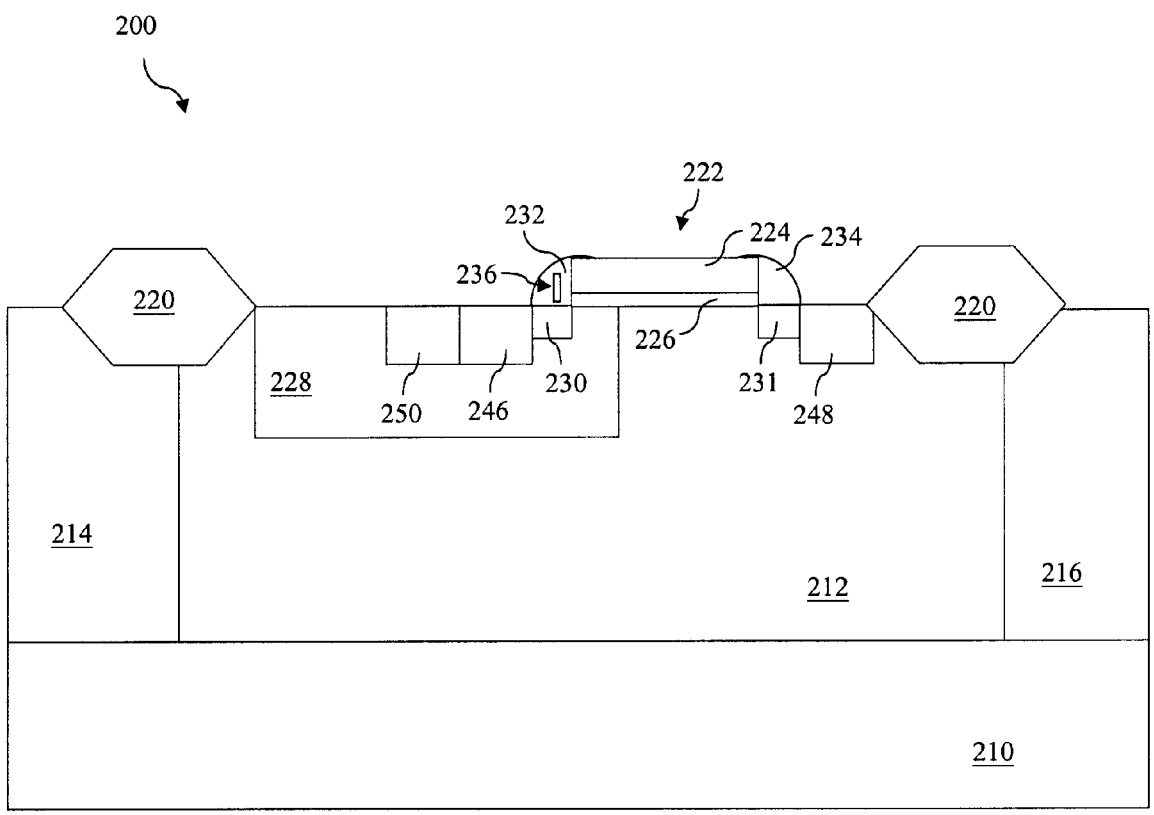

Referring to FIGS. 1 and 9, the method 100 proceeds to step 118 by forming a source region 246 and a drain region 248 in the substrate 210. The source and drain regions 246 and 248 are positioned on both sides of the gate electrode 224 and interposed thereby. In one embodiment, each of the source region 246 and drain region 248 has an edge substantially self-aligned to an edge of the gate spacer 234 or gate spacer 236 as illustrated in FIG. 9. The source region 246 is positioned in the p-type base region 228 and adjacent the light doped source region 230. The source and drain regions include n-type dopant such as phosphorus or arsenic. The source and drain regions are formed by a method such as ion implantation or diffusion. A rapid thermal annealing (RTA) process may be used to activate the implanted dopant. In various embodiments, the source and drain regions may have different doping profiles formed by multi-step implantation.

A contact region 250 may be formed in the substrate 210 and positioned in the p-type base region 228. The contact region 250 includes p-type dopant such as boron with a doping concentration higher than that of the p-type base region 228 to provide a contact for connecting the p-type base region. The contact region is formed by a method including ion implantation and diffusion known in the art.

Figure 10:
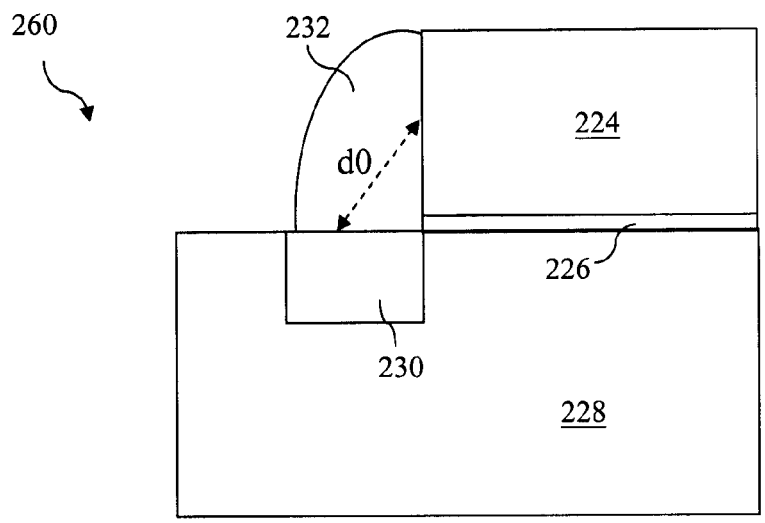
FIG. 10 is a cross-sectional view of a portion of a conventional integrated circuit.
Figure 11:
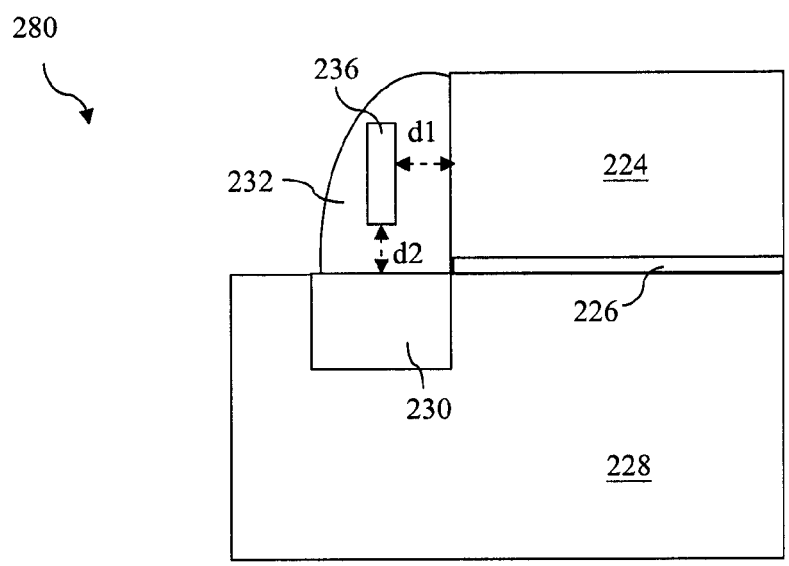
FIG. 11 is a cross-sectional view of one embodiment of a portion of the integrated circuit made by the method of FIG. 1, constructed according to aspects of the present disclosure.

The thus formed integrated circuit provides the conductive feature 232 embedded in the spacer 234 overlying the light doped source region 230 and laterally interposed between the source region 246 and the gate electrode 224. Due to the embedded conductive feature 232, sidewall capacity defined between the gate electrode 224 and the light doped source region 230 is increased. Further explanation is provided below with reference to FIGS. 10 and 11. FIG. 10 is a cross-sectional view of a portion of a conventional integrated circuit. FIG. 11 is cross-sectional view of a portion of the integrated circuit 200 in one embodiment constructed according to aspects of the present disclosure. FIGS. 10 and 11 are used only for illustration and explanation of one embodiment of the spacer structure with embedded conductive feature instead of limiting the scope of the present disclosure. Parameters d0, d1 and d2 in FIGS. 10 and 11 are various effective lengths for relevant sidewall capacitance as illustrated in FIGS. 10 and 11. The sidewall capacitance is defined between the gate electrode 224 and the light doped source drain region 230 with gate spacer 232 as capacitor dielectric. In the traditional integrated circuit of FIG. 10, the relevant sidewall capacitance C0 is proportional to 1/d0. In the disclosed structure having the conductive feature 236 embedded in the gate spacer 232, the sidewall capacitance Ct is associated with C1 (proportional to 1/d1) and C2 (proportional to 1/d2). The total sidewall capacitance Ct of the disclosed integrated circuit may be further quantitatively related with C1 and C1 as 1/Ct=1/C1+C2. It is clear based on the above that Ct is proportional to 1/(d1+d2) and therefore is higher than the sidewall capacitance C0 of the traditional spacer structure. Thus, the induced carrier under the gate spacer 232 with the embedded conductive feature 236 is greater than that of the traditional spacer structure. The embedded conductive feature 232 can be used as an extended gate electrode, which results in more carriers induced by a gate voltage and leads to higher saturation current and lower on-resistance.

Other devices and features can be formed on the substrate 210. Other devices may includes various transistors, various active and passive features configured and coupled to provide proper functions and applications such as various pulse width modulation (PWM) controller, class-D amplifier, photo flash charger, and/or DC-DC converter.

The method 100 and the integrated circuit 200 may further include forming various contacts and metal features on the substrate 210. For example, silicide may be formed by silicidation such as self-aligned silicide (salicide) in which a metal material is formed next to Si structure, then the temperature is raised to anneal and cause reaction between underlying silicon and the metal to form silicide, and un-reacted metal is etched away. The salicide material may be self-aligned to be formed on various features such as the source region, drain region and/or gate electrode to reduce contact resistance.

A plurality of patterned dielectric layers and conductive layers are formed on the substrate 210 to form multilayer interconnects configured to couple the various p-type and n-type doped regions, such as the source region 246, drain region 248, contact region 250, and gate electrode 224.

In one embodiment, an interlayer dielectric (ILD) and a multilayer interconnect (MLI) structure are formed in a configuration such that the ILD separates and isolates each from other of the MLI structure. In furtherance of the example, the MIL structure includes contacts, vias and metal lines formed on the substrate 210. In one example, the MIL structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multi-layer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

The ILD material includes silicon oxide. Alternatively or additionally, the ILD includes a material having a low dielectric constant such as a dielectric constant less than about 3.5. In one embodiment, the dielectric layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer may be formed by a technique including spin-on, CVD, or other suitable processes.

MLI and ILD structure may be formed in an integrated process such as a damascene process. In a damascene process, a metal such as copper is used as conductive material for interconnection. Another metal or metal alloy may be additionally or alternatively used for various conductive features. Accordingly, silicon oxide, fluorinated silica glass, or low dielectric constant (k) materials can be used for ILD. During the damascene process, a trench is formed in a dielectric layer, and copper is filled in the trench. Chemical mechanical polishing (CMP) technique is implemented afterward to etch back and planarize the substrate surface.

Among various embodiments, the present method and structure provide enhanced performance of high saturation current and reduced on-resistance. The disclosed structure and method may have various embodiments, modifications and variations. In one example, the high power semiconductor devices may further include a stress layer overlying the substrate and gate features. The stress layer may comprise silicon nitride, silicon oxynitride, silicon oxide, and silicon carbide. In another embodiment, the source and drain regions may have different structures, such as raised, recessed, or strained. It is understood that the power integrated circuit 200 is illustrated herein only as an example. The high power semiconductor device may not be limited to an NMOS device and can be extended to a PMOS having an embedded poly feature in the gate spacer between the source region and gate electrode with a similar structure and configuration except that all doping types may be reversed and dimensions are modified according to PMOS design. In other embodiments, the high power integrated circuit may be a lateral diffused MOS (LDMOS) formed in a dual-well structure (a p-type well and a n-type well) within the substrate 210. Further embodiments may also include, but are not limited to, vertical diffused metal-oxide-semiconductor (VDMOS), other types of high power MOS transistors, Fin structure field effect transistors (FinFET), and strained MOS structures.

Thus, the present disclosure provides a semiconductor device. The device includes a source region and a drain region disposed in a substrate wherein the source and drain regions have a first type of dopant; a gate electrode formed on the substrate interposed laterally between the source and drain regions; a gate spacer disposed on the substrate and adjacent a side of the gate electrode and laterally between the source region and the gate electrode; and a conductive feature embedded in the gate spacer.

In various embodiments, the semiconductor device may further include a base region in the substrate, having a second type of dopant different from the first type of dopant, disposed partially underlying the gate electrode, surrounding the source region. The semiconductor device may further include a contact region disposed in the base region, having the second type of dopant, and proximate the source region. The semiconductor device may further include a well region having the first type of dopant, disposed in the substrate, and surrounding the drain region and the base region. The semiconductor device may further include a light doped source region of the first type of dopant disposed in the base region, underlying the conductive feature embedded in the gate spacer. Each of the gate electrode and the conductive feature may include doped polycrystalline silicon. The conductive feature may be vertically separated from the substrate by a dielectric layer having a thickness more than about 200 angstrom. The gate spacer may include a material selected from the group consisting of silicon oxide, silicon nitride, silicon oxynitride, and combinations thereof. The semiconductor device may further include a gate dielectric layer vertical interposed between the gate electrode and the substrate.

The present disclosure also provides a method for forming a integrated circuit. The method includes forming a gate electrode on a semiconductor substrate; forming a gate spacer adjacent a sidewall of the gate electrode and a conductive feature embedded in the gate spacer; forming a light doped source region in the substrate laterally edging the gate electrode and underlying the conductive feature; and forming a source region and drain region in the substrate and laterally interposed by the gate electrode, wherein the source region, drain region and light doped source region each include a first type of dopant.

The present disclosure also provides various embodiments of the method. The method may further include forming a base region of a second type of dopant different from the first type of dopant in the substrate, surrounding the source region and the light doped source region, and partially underlying the gate electrode. The method may further include forming a well region of the first type of dopant in the substrate, having the base region and the drain region disposed therein. The forming of the gate spacer and the conductive feature may include forming a first dielectric layer on the gate electrode and the substrate; forming a conductive layer on the first dielectric layer; etching the conductive layer to form the conductive feature laterally between the source and the gate electrode; forming a second dielectric layer on the gate electrode, the conductive feature and the first dielectric layer; and etch the second dielectric layer to form the gate spacer with the conductive featured embedded therein. The forming of the first conductive layer may include forming a polycrystalline silicon layer. The forming of the polycrystalline silicon may include performing a chemical vapor deposition (CVD) process utilizing a chemical silane. The forming of the polycrystalline silicon may include performing a CVD process with a temperature ranging between about 600° C. and about 630° C. The method may further include performing an ion implantation to the polycrystalline silicon layer. The forming of the first dielectric layer and/or the forming of the second dielectric layer may include forming a silicon oxide layer. The etching of the conductive layer and the etching of the second dielectric layer each may include forming performing an anisotropically etching process. The method may further include forming a gate dielectric vertically interposed between the gate electrode and the substrate. The method may further include forming a light doped source region on the substrate after the forming of the gate electrode and edging the gate electrode; forming a source region and a drain region laterally interposed by the gate electrode after the forming the gate spacer; and forming a p-type base region in the substrate before the forming the gate electrode, surrounding the source region and the light doped source region, and partially underlying the gate electrode. The forming of the p-type base region may include implementing ion implantation with a tilt angle of about 45 degree.

The present disclosure also provides a semiconductor device. The method includes a source region and a drain region disposed in a substrate wherein the source and drain regions; a gate electrode formed on the substrate interposed laterally between the source and drain regions; and a gate spacer with a conductive feature embedded therein, laterally adjacent a sidewall of the gate electrode and laterally interposed between the source region and the gate electrode.

In various embodiments of the semiconductor device, the conductive feature may include doped polycrystalline silicon. The semiconductor device may further include a light doped source region underlying the conductive feature embedded in the gate spacer. The semiconductor device may further include a p-type base region formed in the substrate, surrounding the source region and the light doped source region, and partially underlying the gate electrode. The semiconductor device may further include an n-type well region formed in the substrate surrounding the p-type base region and drain region. The semiconductor device may further include an isolation feature disposed on the substrate defining active defining an active area, using a technique selected from the group consisting of local oxidation of silicon (LOCOS) and shallow trench isolation (STI).

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device comprising:
   a source region and a drain region disposed in a substrate, wherein the source and drain regions have a first type of dopant;
   a gate electrode formed on the substrate interposed laterally between the source and drain regions;
   a gate spacer disposed on the substrate and laterally between the source region and the gate electrode, adjacent a side of the gate electrode;
   a conductive feature embedded in the gate spacer; and
   a base region in the substrate, having a second type of dopant different from the first type of dopant, disposed partially underlying the gate electrode surrounding the source region defining a channel under the gate electrode of length "L", wherein L is substantially less than half the length of the gate electrode.

2. The semiconductor device of claim 1, further comprising a contact region disposed in the base region, having the second type of dopant, and proximate the source region.

3. The semiconductor device of claim 1, further comprising a well region having the first type of dopant, disposed in the substrate, and surrounding the drain region and the base region.

4. The semiconductor device of claim 1, further comprising a light doped source region of the first type of dopant disposed in the base region, underlying the conductive feature embedded in the gate spacer.

5. The semiconductor device of claim 1, wherein the conductive feature comprises doped polycrystalline silicon.

6. The semiconductor device of claim 5, wherein the conductive feature is vertically separated from the substrate by a dielectric layer having a thickness more than about 200 angstroms.

7. The semiconductor device of claim 1, wherein the gate spacer comprises a material selected from the group consisting of silicon oxide, silicon nitride, silicon oxynitride, and combinations thereof.

8. A semiconductor device comprising:
   a base region formed in a semiconductor substrate wherein the semiconductor substrate includes a first type of dopant and the base region includes a second type of dopant different from the first type of dopant;
   a gate electrode formed on the substrate and partially overlying the base region;
   a gate spacer disposed on the substrate and adjacent a side of the gate electrode;
   a conductive feature embedded in the gate spacer; and
   a lightly doped source/drain (LDD) region formed in the semiconductor substrate, having the first type of dopant, disposed in the base region, and underlying the conductive feature embedded in the gate spacer;
   wherein the base region is disposed partially underlying the gate electrode surrounding one the LDD region to define a channel under the gate electrode of length "L", wherein L is substantially less than half the length of the gate electrode.

9. The semiconductor device of claim 8, further comprising a heavily doped source region, having the first type of dopant, disposed in the base region, and adjacent the LDD feature.

10. The semiconductor device of claim 8, wherein the conductive feature is vertically separated from the substrate by a dielectric layer.

11. The semiconductor device of claim 8, wherein the conductive feature comprises doped polycrystalline silicon.

12. A semiconductor device comprising:
   a gate dielectric layer disposed on a semiconductor substrate;
   a gate electrode formed on the gate dielectric layer;
   a gate spacer disposed on the substrate and on a sidewall of the gate electrode;
   a conductive feature embedded in the gate spacer; and
   a base region in the substrate, having a second type of dopant different from the first type of dopant, disposed partially underlying the gate electrode surrounding the source region defining a channel under the gate electrode of length "L", wherein L is substantially less than half the length of the gate electrode.

13. The semiconductor device of claim 12, further comprising a light doped source/drain (LDD) feature, having a first type of dopant, disposed in the semiconductor substrate and underlying the conductive feature embedded in the gate spacer.

14. The semiconductor device of claim 13, further comprising a heavily doped source region, having the first type of dopant, disposed in the base region, and adjacent the LDD feature.

15. The semiconductor device of claim 14, further comprising a contact region disposed in the base region, having the second type of dopant, and proximate the source region.

16. The semiconductor device of claim 15, further comprising a well region having the first type of dopant and surrounding the base region.

17. The semiconductor device of claim 12, wherein the conductive feature comprises polysilicon.

18. The semiconductor device of claim 12, wherein the conductive feature embedded in the gate spacer is isolated by the gate spacer from the gate electrode and the semiconductor substrate.

* * * * *